(12) United States Patent
Kawakami et al.

(10) Patent No.: US 11,232,932 B2
(45) Date of Patent: Jan. 25, 2022

(54) PLASMA PROCESSING APPARATUS AND PLASMA PROCESSING METHOD

(71) Applicant: HITACHI HIGH-TECH CORPORATION, Tokyo (JP)

(72) Inventors: Masatoshi Kawakami, Tokyo (JP); Kohei Sato, Tokyo (JP); Yasushi Sonoda, Tokyo (JP); Masahiro Nagatani, Tokyo (JP); Makoto Kashibe, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 411 days.

(21) Appl. No.: 16/135,437

(22) Filed: Sep. 19, 2018

(65) Prior Publication Data
US 2019/0164725 A1    May 30, 2019

(30) Foreign Application Priority Data

Nov. 28, 2017   (JP) .............................. JP2017-227353

(51) Int. Cl.
*H01J 37/32*       (2006.01)
*H01L 21/02*       (2006.01)
*H01L 21/311*      (2006.01)

(52) U.S. Cl.
CPC .. *H01J 37/32449* (2013.01); *H01J 37/32229* (2013.01); *H01J 37/32238* (2013.01); *H01J 37/32458* (2013.01); *H01J 37/32844* (2013.01); *H01L 21/02274* (2013.01); *H01L 21/31116* (2013.01); *H01J 2237/3341* (2013.01)

(58) Field of Classification Search
CPC ........... H01J 37/32449; H01J 37/32844; H01J 37/32238; H01J 2237/3341; H01J 37/32174; H01L 21/02274; H01L 21/31116; H01L 21/67069; H01L 21/3065; Y02C 20/30; H05H 1/46
See application file for complete search history.

(56) References Cited

U.S. PATENT DOCUMENTS

| 2008/0078505 A1* | 4/2008 | Kofuji ............... H01L 21/32137 |
| | | 156/345.33 |
| 2010/0167426 A1 | 7/2010 | Kofuji et al. |
| 2015/0004721 A1* | 1/2015 | Akimoto ........... H01J 37/32972 |
| | | 438/9 |

FOREIGN PATENT DOCUMENTS

| JP | 2007287924 A | 11/2007 |
| JP | 2008091651 A | 4/2008 |

* cited by examiner

*Primary Examiner* — Yu-Hsi D Sun
(74) *Attorney, Agent, or Firm* — Miles & Stockbridge, P.C.

(57) ABSTRACT

A plasma processing method for efficiently processing a wafer using plasma which includes two processing steps and a bridging step between the two processing steps. The plasma processing method includes: supplying a processing-use gas into a processing chamber during a processing step; supplying a bridging-use gas into the processing chamber during a bridging step; switching the supply of the processing-use gas from a first gas supply unit and the bridging-use gas from a second gas supply unit to the processing chamber in transition between the two processing steps and the bridging step; and regulating a flow rate of the bridging-use gas to be supplied during the bridging step to a flow rate regarded equal to a supply amount of the processing-use gas to be supplied during a succeeding processing step out of the two processing steps.

4 Claims, 7 Drawing Sheets

FIG.2

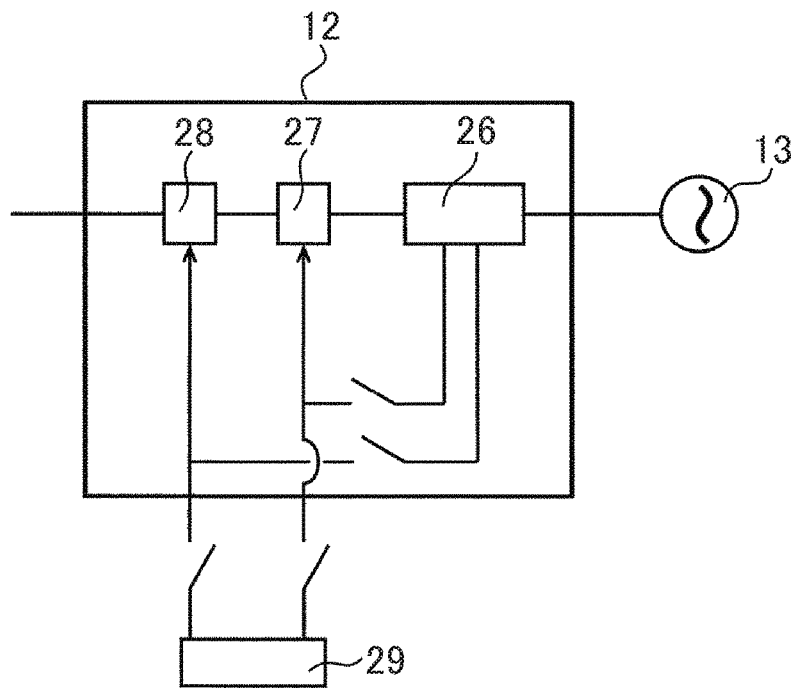

FIG.3

| STEP NAME | PROCESSING STEP A | TRANSITION STEP | PROCESSING STEP B |
|---|---|---|---|
| FLOW RATE OF GAS PASSING THROUGH CHAMBER INTRODUCTION GAS LINE | CONDITION A (ETCHING GAS) | PSEUDO CONDITION B (ARGON GAS) | CONDITION B (ETCHING GAS) |
| FLOW RATE OF GAS PASSING THROUGH WASTE GAS LINE | PSEUDO CONDITION B (ARGON GAS) | CONDITION A→B (ETCHING GAS) | PSEUDO CONDITION C(A) (ARGON GAS) |
| PROCESSING CHAMBER PRESSURE | CONDITION A | CONDITION A→B | CONDITION B |
| MICROWAVE POWER | CONDITION A | CONDITION A→B | CONDITION B |
| MAGNETIC FIELD COIL ELECTRIC CURRENT | CONDITION A | CONDITION A→B | CONDITION B |
| WAFER BIAS POWER | CONDITION A | OFF | CONDITION B |
| FIRST WAFER BIAS MATCHING VARIABLE ELEMENT | CONDITION A | CONDITION A→B | CONDITION B |
| SECOND WAFER BIAS MATCHING VARIABLE ELEMENT | CONDITION A | CONDITION A→B | CONDITION B |

PLASMA PROCESSING APPARATUS AND PLASMA PROCESSING METHOD

CROSS-REFERENCE TO RELATED APPLICATIONS

The present application claims priority to Japanese Patent Application No. 2017-227353, filed Nov. 28, 2017. The contents of this application are incorporated herein by reference in their entirety.

BACKGROUND

The present invention relates to a plasma processing apparatus and a plasma processing method where a substrate-like specimen such as a semiconductor wafer disposed in a processing chamber formed inside a vacuum vessel is processed by plasma generated using a gas supplied into the processing chamber. The present invention more particularly relates to a plasma processing apparatus and a plasma processing method where a specimen is processed by switching gases for processing which are supplied into a processing chamber and have different compositions.

In steps of manufacturing semiconductor devices on a mass production basis, processing has been performed where a substrate-like specimen such as a semiconductor wafer is disposed in a processing chamber formed inside a vacuum vessel in a reduced pressure, and predetermined processing such as etching, for example, is applied to the specimen using plasma generated in the processing chamber. Along with recent steady progress in miniaturization of a circuit of a semiconductor device, higher accuracy of working is demanded in the abovementioned processing using plasma such as etching, for example. That is, accuracy of working has been shifted from order of nm to order of angstrom.

In realizing such a demand for processing of a specimen using plasma, there has been considered that controllability of processing is enhanced by shortening times of respective steps contributing to etching of a film layer which is an object to be processed in the film structure of a surface of the specimen by performing the following processing. That is, such processing includes processing where steps of two preceding and succeeding processing having different conditions are performed sequentially from one step to another step or processing where these steps are repeatedly performed plural times. On the other hand, when the extinction and the generation of plasma are performed between the plurality of steps for processing such a specimen, ignition and stabilization of plasma take time. Accordingly, to further shorten time of the whole processing, the preceding step is shifted to the succeeding step while keeping the generation of plasma continuously.

However, when the generation (discharge) of plasma is performed continuously in this manner, between the preceding step and the succeeding step, a change in processing conditions such as a kind, a supply amount, a pressure of a gas influences the preceding and succeeding steps thus giving rise to a drawback that the difference occurs in reproducibility of processing or among processing apparatuses.

As a prior art for overcoming such a drawback, for example, there has been known a technique disclosed in Japanese Unexamined Patent Application Publication No. 2007-287924. In this example, a plasma processing apparatus is disclosed where a discharge is continued between steps in which etching gases of different kinds or etching gases having different compositions are used in a processing chamber obtained by reducing a pressure in a vacuum vessel. In the plasma processing apparatus, by performing processing including a transition step where a discharge is continued using an inert gas between steps of preceding and succeeding processing, an adverse effect caused by mixing of different etching gases during a period before and after the preceding processing and the succeeding processing including a boundary between the steps can be suppressed thus suppressing the abovementioned difference in reproducibility and among processing apparatuses.

Japanese Unexamined Patent Application Publication No. 2008-091651 discloses a plasma processing apparatus where a shower plate is disposed at an upper portion of a processing chamber and forms a ceiling surface of the processing chamber, and introduction holes through which a processing-use gas is introduced into the processing chamber are formed in the shower plate. The plasma processing apparatus has: a gas line for introducing the gas into the processing chamber at a high speed and smoothly with favorable reproducibility of a gas flow rate and a gas pressure; and a gas line for discharging the gas to a dry pump. A high speed control of a process gas can be realized by switching the gas lines using a valve.

SUMMARY

The following points are not sufficiently taken into consideration in the abovementioned prior art and hence, the prior art still has drawbacks.

That is, in the abovementioned prior art, at the time of performing the transition step using an inert gas, with the use of one mass flow controller (a regulator of a gas flow rate or a gas speed), a flow rate is regulated such that a pressure condition of the preceding step is obtained and, thereafter, using this mass flow controller, the flow rate is changed so as to regulate the pressure condition to a pressure condition of the next step. In such an operation, the change of the flow rate is performed using one mass flow controller and hence, a time from a point of time that the flow rate is changed to a point of time that a pressure in the pipe is regulated is prolonged. Accordingly, in the processing where steps of the plurality of processing where the respective processing are performed with different gas flow rates respectively are continuously performed, even when the gas of the same kind is used, for example, time necessary for changing an amount of a gas to be supplied in the preceding and succeeding two steps (transition step) is a time which most largely affects (restricts) a time necessary for performing the processing because such a time is longest within a time the whole processing requires. In such a case, there arises a drawback that when the transition step is prolonged, time necessary for the whole processing is prolonged so that the number of specimens to be processed within a unit time (so-called throughput) and efficiency of processing are impaired.

To reduce time necessary for changing supply amounts of these gasses, a technique is considered where gas supply units are provided for regulating conditions of the respective preceding and succeeding steps, and gases are supplied by switching the gas supply units corresponding to the respective steps so that the gas supply conditions can be switched with a time shorter than a time necessary for changing the condition for supplying one gas. For example, when a flow rate of a gas is changed in two different consecutive steps formed of preceding and succeeding processing, two gas supply paths and mass flow controllers which are disposed on respective supply paths are provided. During the preceding step is performed, a gas is supplied from one gas supply path under one supply condition, and the mass flow controller on the other gas supply path in a state separated from one gas supply path regulates a flow rate such that a condition in the succeeding step is obtained in advance, and the gas supply path is switched from one gas supply path to the other gas supply path after the preceding step is finished and before the succeeding step is started. Accordingly, the supply of gas can be switched within a short time compared to the case where one mass flow controller which requires time for changing a flow rate in general is used. However, in such a case, even when the same kind gas is supplied into one processing chamber, for example, a plurality of mass flow controllers are necessary due to a change in a flow rate. Accordingly, there arise drawbacks that a manufacturing cost of the apparatus is increased or a space for accommodating the mass flow controllers becomes large compared to the prior art so that an area which the apparatus occupies is increased.

Further, the abovementioned prior art, to change a flow rate and a pressure of a gas to be supplied at a high speed, includes a gas supply unit which has a gas supply line through which the gas is supplied to a processing chamber, and a gas discharge line which is communicated with an exhaust pump disposed outside the vacuum vessel, and through which the gas is discharged without being supplied to the processing chamber. The gas supply unit performs the regulation in which the supply of the gas from a gas source through the mass flow controller is switched by the valve in response to a condition of processing in the processing chamber. However, in performing switching under a condition that a plurality of different kinds of gases are used in the gas supply unit, when a mixed gas is switched from a state where the gas flows through the gas discharge line to a state where the gas flows through the gas supply line, the gas supplied to the switched processing chamber is mixed in conformity with the condition in the processing chamber. In such an operation, a change in pressure occurs in the gas line and hence, the condition is displaced from the condition under which the gas is to be supplied to the processing chamber actually so that a result of processing does not fall within an allowable range. To prevent such a phenomenon, when the introduction of the gas into the processing chamber is withheld until the pressure is stabilized and agrees with the required condition, time necessary for switching is prolonged to the contrary thus giving rise to a drawback that processing efficiency is impaired.

A flow rate of an inert gas to be supplied into the processing chamber is regulated in the transition step such that values of a pressure in the chamber and a degree of opening of a variable conductance valve during the transition step become equal to values of a corresponding pressure and a corresponding degree of opening at the time of starting the next step or during the step. However, when a gas to be supplied to the processing chamber in the transition step or during the transition to the next step is switched from an inert gate to a processing-use gas, due to a change in a kind of gas or a change in composition of the gas, the flow of the gas in the gas line from the mass flow controller to the shower plate changes. Accordingly, for example, even when the pressure is regulated to the pressure in the next step in the transition step, during the transition from the transition step to the next step or during switching, the pressure in the chamber changes and a flow rate of the gas is deviated from the predetermined flow rate, and such a change in pressure and the deviation of the flow rate adversely affects the processing of the next step so that a yield of processing of specimens is impaired. This drawback has not been taken into consideration in the abovementioned prior art.

Embodiments can provide a plasma processing method in which efficiency of processing is enhanced by changing a condition of a gas to be supplied into a processing chamber within a short time such that a yield of processing is enhanced.

For example, embodiments can include a plasma processing method for processing a wafer using plasma which includes two processing steps and a bridging step between the two processing steps. The first processing step can include supplying a processing-use gas into a processing chamber during a processing step; and the second processing step can include supplying a bridging-use gas into the processing chamber during the bridging step. The method can further includes switching the supply of the processing-use gas from a first gas supply unit and the bridging use gas from a second gas supply unit to the processing chamber in transition between the two processing steps and the bridging step; and regulating a flow rate of the bridging-use gas to be supplied during the bridging step to a flow rate regarded equal to a supply amount of the processing-use gas to be supplied to the processing chamber during a succeeding step out of the two processing steps.

Furthermore, in a transition between the first and second processing steps and the bridging step, the method further includes switching (1) a supply of a first processing-use gas for the first processing step and a supply of a second processing-use gas for the second processing step from a processing-use gas supply unit into a gas introducing line which is provided in communication with the processing chamber during each of two processing steps and (2) a supply of the bridging-use gas from a bridging-use gas supply unit into the gas introducing line during the bridging step, and a flow rate of the bridging-use gas supplied into the gas introducing line during the bridging step is regulated such that a pressure of the bridging-use gas is equal to a pressure of the second processing-use gas to be supplied to the processing chamber via the gas introducing line during the second processing step out of the first and second processing steps at predetermined positions on the gas introducing line and an introducing port of the gas introducing line for the processing chamber.

According to the present invention, it is possible to reduce the worsening of reproducibility of a process function and the apparatus difference which are drawbacks in a short time step. With respect to the flow of the process gas line from the shower plate to the mass flow controller in the transition step, it is possible to simulate a process gas using an inert gas and hence, the flow can be stabilized in advance. Accordingly, it is possible to suppress a change in the process gas line at the time of switching an actual process gas and a change in pressure in the chamber caused by such a change in the process gas line thus realizing a short time step.

BRIEF DESCRIPTION OF THE DRAWINGS

FIG. 2 is a circuit block diagram schematically showing the configuration of a matching circuit 12 of the plasma processing apparatus according to the embodiment shown in FIG. 1;

FIG. 3 is a table showing the flow of a plurality of steps which form processing of a wafer which the plasma processing apparatus according to the embodiment shown in FIG. 1 performs;

DETAILED DESCRIPTION

Figure 1:
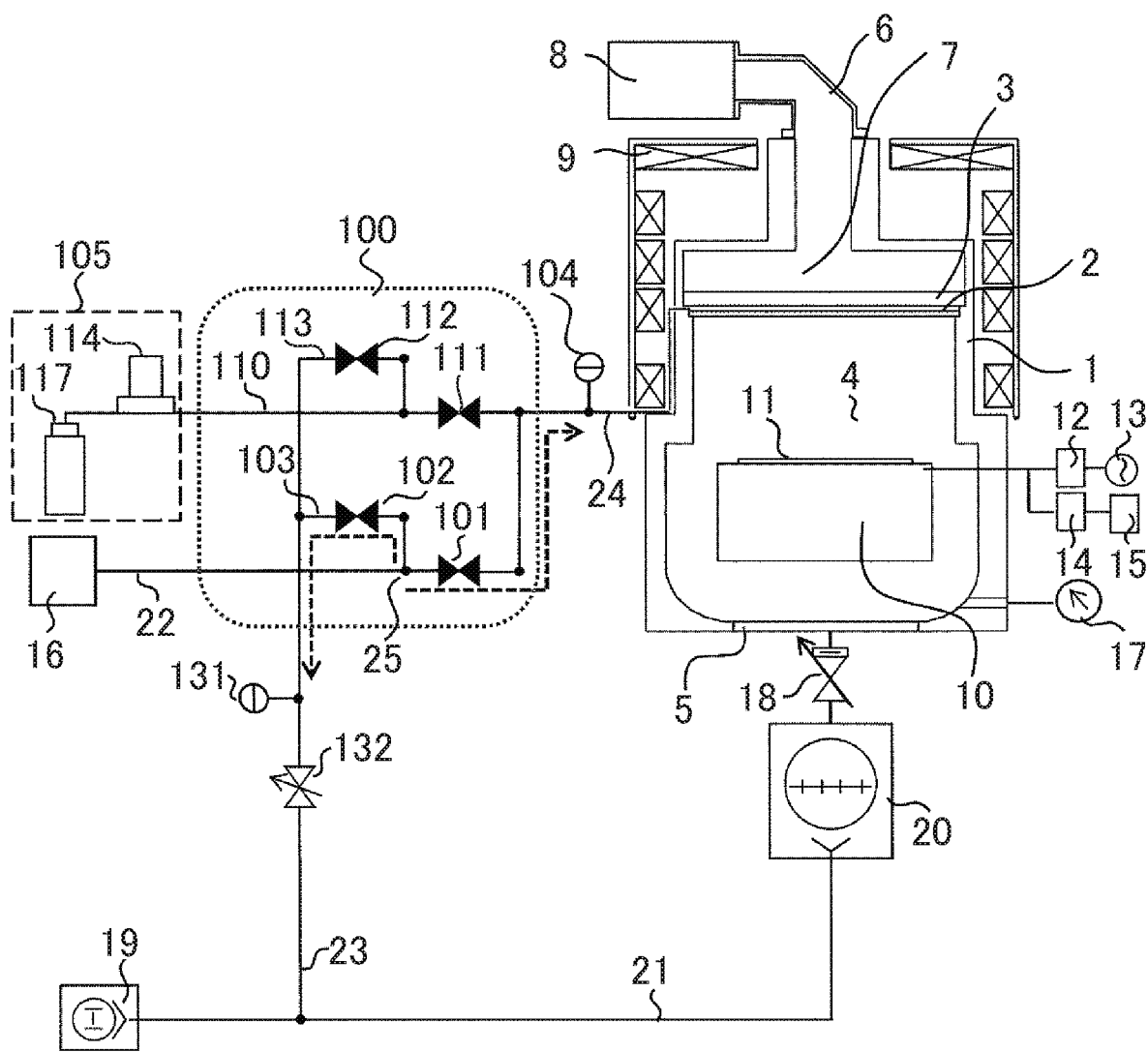
FIG. 1 is a longitudinal cross-sectional view showing the schematic configuration of a plasma processing apparatus according to an embodiment of the present invention.

A plasma processing apparatus according to the embodiment includes a gas supply unit which includes: a gas supply line through which a gas is supplied to a processing chamber; and a gas discharge line which is communicated with a discharge pump disposed outside a vacuum vessel and through which a gas is discharged without being supplied to the processing chamber. The plasma processing apparatus is configured such that the supply of a gas from a gas source through a mass flow controller in response to a condition of processing in the processing chamber is switched by at least one valve provided to the gas supply unit.

However, in such a configuration, in performing switching under a condition that a plurality of different kinds of gases are used in the gas supply unit, when a mixed gas is switched from a state where the gas flows through the gas discharge line to a state where the gas flows through the gas supply line, the gas supplied to the switched processing chamber is mixed in conformity with the condition in the processing chamber. In such an operation, a change in pressure occurs in the gas line and hence, the condition is displaced from the condition under which the gas is to be supplied to the processing chamber actually so that there is a concern that a result of processing does not fall within an allowable range. Further, to prevent such a phenomenon, when the introduction of the gas into the processing chamber is withheld until the pressure is stabilized and agrees with the required condition, time necessary for switching is prolonged to the contrary thus giving rise to a drawback that processing efficiency is impaired.

Further, the abovementioned change in pressure is affected by irregularities in responsiveness when the valve is opened or closed firstly. To suppress such irregularities, a technique is considered where a valve such as a solenoid valve, for example, of a gas line on a side where a gas is discharged by a dry pump is closed firstly. However, a speed at which the solenoid valve is opened or closed depends on such a valve and sizes such as a length and a diameter of a pipe passage to which the valve is connected. In an actual apparatus, such a speed may take approximately 0.2 seconds (expressed as "s" hereinafter). In the prior art, a time necessary for an opening or closing operation of the valve, and a time necessary for communication between the valve and a controller which transmits an operation command signal to the valve are not taken into consideration.

Irregularities of approximately 0.1 s to 0.2 s exist with respect to time for communication and hence, it is necessary to transmit a command with a tolerance time (margin) by taken into account irregularities in time necessary for an operation and a time necessary for communication. Depending on cases, the valve is opened or closed approximately 0.5 s earlier than a desired point of time at which the opening or closing operation is finished. In this case, a change in pressure which is induced by the increase of a pressure in an integrated block is considered as a task to be solved.

Further, assuming a case where the valve is closed 0.5 s or more earlier than a point of time that the supply of a gas is switched on an arbitrary gas line, it is necessary to further taken into account a rise time of a mass flow controller for a gas which flows next and a time until a pressure becomes stable after closure of a valve in the gas line at which the valve is closed as margins. For example, when these times are respectively 1 s, it is necessary to start flowing of a gas 2.5 s or more earlier than a predetermined point of time at which a gas is switched to a gas line into which the gas newly flows by switching. In the prior art, because of these reasons, the realization of a technique by which a gas can be supplied into a processing chamber within a shorter time by switching has been considered as a problem to be solved.

With the use of a plasma processing apparatus where a solenoid valve is directly mounted on the apparatus as a valve for opening or closing a gas line, the supply of a gas between the lines can be switched within a shorter time, for example, within approximately 15 ms. However, when the solenoid valve is directly mounted on the gas line, an occupying space in a gas supply unit is increased by an amount necessary for mounting the solenoid valve and, further, a cost per each valve is pushed up correspondingly.

In the plasma processing apparatus, to achieve the task of realizing a desired processing condition in the processing chamber with high responsiveness for enhancing accuracy of working by processing of a specimen, it is desirable to provide a shorter processing-use gas line between the gas supply unit which includes the mass flow controller and the valve which opens or closes the gas line on which the mass flow controller is disposed and the vacuum vessel or an inlet of the processing chamber in the vacuum vessel. In view of the above, it is desirable that a gas supply unit body be disposed close to the processing chamber. However, a recent plasma processing apparatus includes a gas supply unit having a large volume which allows introduction of large kinds of gases into the gas supply unit to cope with a demand that plural kinds of gases can be used, particularly, a specimen is stored and disposed inside a processing chamber, is subjected to processing in large number of steps under different conditions without taking out the specimen from the processing chamber. It is extremely difficult to dispose the unit having such parts at a position close to the vacuum vessel, and a pipe having a length of approximately 1 m or more has been necessary in an actual plasma processing apparatus.

In performing processing by switching gases to be supplied into the processing chamber, reproducibility and the apparatus difference with other processing unit having a processing chamber in a vacuum vessel become problems with respect to processing conditions other than flow rates of a plurality of processing-use gases having different compositions supplied into the processing chamber by switching and a pressure in the processing chamber. For example, as parameters which form the processing condition, matching of microwave power for generating plasma, an amount of an electric current supplied to coils forming a magnetic field, matching of power when high frequency power for forming a bias is supplied to a specimen and the like are named.

These parameters have respectively different transitional response times in response to inputting of command signals which increase or decrease values thereof respectively, and these parameters become factors which cause worsening of reproducibility and the apparatus difference. For example, in a plasma processing apparatus according to the prior art, it is considered that, in general, approximately 0.2 s is necessary at maximum as a time necessary for matching of microwave power, approximately 2 s is necessary at maximum as a time necessary for matching in a transitional response of an electric current of a coil, and a time of approximately 0.5 s is necessary for matching of bias-use high frequency power. In the plasma processing apparatus, when a period of transition between the respective steps of processing for processing a specimen by switching gases having different flow rates or compositions to be supplied to the processing chamber in conformity with respective processing steps having different conditions which are performed discontinuously and successively, a rate of transitional response time of the abovementioned parameters with respect to the period of the transition step between the steps is increased and, eventually, the transitional response affects a starting time of the next step thus giving rise to a possibility that processing does not start under a desired processing condition so that a processing condition or reproducibility of a shape of a specimen after working is deteriorated or the apparatus difference is increased.

The embodiment of the present invention provides a plasma processing apparatus for applying etching to a specimen using plasma, the plasma processing apparatus including: a processing chamber which is disposed inside a vacuum vessel having a lower portion to which a vacuum discharge device is connected and is hermetically sealed between the inside and the outside of the processing chamber; a dielectric window which forms a lid disposed on an upper portion of vacuum vessel and allows an electric field for generating plasma to pass therethrough; a specimen base which is disposed in a lower portion of the processing chamber and has an upper surface on which a substrate-like specimen such as a semiconductor wafer which forms a member to be treated is placed; a shower plate which forms a ceiling surface of the processing chamber below the dielectric window and is disposed so as to opposedly face the upper surface of the specimen base; a gas supply unit which is connected to a gas introduction hole disposed on the shower plate and supplies a processing-use gas into the processing chamber; an electric field introducing part which introduces an electric field through the dielectric window; and a magnetic field generating portion which generates a magnetic field to be supplied into the processing chamber for generating plasma by exerting an interaction with the electric field. The plasma processing apparatus further includes a switching mechanism which is disposed on one gas supply line through which a process gas is supplied from a gas supply unit to a pressure reduced processing chamber via the shower plate, and switches and supplies a plurality of gases from a gas supply unit having different flow rates or compositions.

The gas switching mechanism includes: a gas introducing line which is communicably connected to the processing chamber in the vacuum vessel; one etching gas line which is communicably connected with the gas introducing line and through which an etching processing-use gas flows toward the processing chamber; one bridging gas introducing line through which a bridging gas supplied to the processing chamber in a step between a plurality of steps of the processing (transition step) flows toward the processing chamber; one waste gas line which is connected between the bridging gas introducing line and the etching gas line and a rough suction discharge line; and four valves which switches the supply of an etching gas from the etching gas line and the supply of a bridging gas from the bridging gas line between the gas introducing line and the discharge line. Further, in a preferred embodiment, the plasma processing apparatus includes: a gas introducing line; a pressure gauge which detects a pressure in the gas introducing line; a pressure gauge which detects a pressure in the waste gas line; a variable conductance valve which is disposed on the waste gas line; and a pressure controller which regulates an operation of the variable conductance valve such that the pressure in the gas introducing line and the pressure in the waste gas line become equal.

In this embodiment, in the bridging step performed before two steps performed discontinuously under different conditions with the transition step sandwiched therebetween using the gas switching mechanism start respectively, a gas of a kind, a composition, or a flow rate used in each step flows through the waste gas line and is discharged in advance so that the flow of a gas in an etching gas line is brought into a stable state (steady state), and a pressure in the waste gas line is regulated to become equal to a pressure in the gas introducing line. With such an operation, in switching a gas introduced into the gas introducing line into a gas from the etching gas line at the time of starting the respective steps, it is possible to reduce a change of a flow rate of an etching gas introduced from the gas introducing line and, eventually, from the gas introduction holes of the shower plate on the ceiling surface of the processing chamber and a change in pressure in the processing chamber and hence, shifting can be realized smoothly or within a short time so that next processing step can be started whereby efficiency of processing and accuracy of shape of a worked product after processing can be enhanced.

The gas switching mechanism is designed such that a length and a diameter profile of a pipe from the valve for switching on the etching gas line to the pressure gauge on the gas introducing line in a gas flow direction become equal to a corresponding length and a corresponding diameter profile of a pipe from the valve portion for switching to the pressure gauge on the waste gas line. Due to such a configuration, by correcting a flow rate of a bridging gas supplied in the bridging step by taking into account a characteristic of a kind of gas, the flow of a gas in the next processing step can be simulated and hence, the flow of the simulated gas can be stabilized in the etching gas line during the bridging step period whereby, in starting the next step, it is possible to shorten a time for stabilizing (making stable) a pressure in the gas introducing line or in the processing chamber after switching of the gas.

The gas switching mechanism may not be disposed inside the gas supply unit, and may be arranged at different places. In this case, a valve for high speed switching where a solenoid valve having a large capacity is mounted on the valve can be used and hence, it is unnecessary to displace opening and closing switching timing by taking into account a delay in response of the valve whereby time necessary for performing the switching step can be shortened.

Also in the case where same kind of gas or the same flow rate is used in the preceding and succeeding processing steps, a time for performing the bridging step between the processing steps can be shortened. In addition to the above, an operation is performed in the gas supply unit in the same manner as the conventional plasma processing apparatus and hence, it is unnecessary to replace the valve in the gas supply unit with an expensive valve for high speed switching, and it is sufficient to use a high speed switching valve only in the gas switching mechanism part. Accordingly, a product cost can be suppressed to a low level.

By disposing the gas switching unit between the gas supply unit and the processing chamber, even when plural kinds of gases are used, a processing-use gas formed by mixing plural kinds of gasses flows into the waste gas line from the etching gas line and the flow of the gas is stabilized and, thereafter, switching of the gas is performed. Accordingly, unlike the prior art, the gases are not mixed again at the time of switching the gases and hence, a change in pressure in the gas introducing line which occurs when the gases are mixed again is suppressed.

The steps of the specimen to be processed in the plasma processing apparatus according to this embodiment include, to be more specific, two processing steps, that is, the processing step A and the processing step B which form the steps of the processing, and the transition step which is performed as the bridging step between these processing steps A and B. In the transition step, high frequency power for forming a bias potential on an upper surface of a specimen is stopped (OFF), and parameters such as microwave power, an amount of electric current supplied to the coil and a pressure in the processing chamber are regulated such that the parameters agree with the processing condition of the next processing step B. Further, a noble gas (inert gas) such as Ar of a flow rate equal to a flow rate of one kind of gas or a processing-use gas formed by mixing plural kinds of gases supplied as a condition of processing in the processing step B or of a flow rate equivalently corrected by viscosity by taking into account the difference in composition when the gas is formed of plural kinds of gases (including a flow rate ratio of respective kinds of gases or partial pressures) is supplied by switching to the gas introducing line and is introduced into the processing chamber.

During the transition step, parameters such as microwave power, an amount of electric current to the coil, a pressure in the processing chamber, a flow rate of a gas, a pressure in a line are changed from values for the preceding processing step A to values for the succeeding processing step B. Accordingly, an adverse effect that time necessary for matching of microwave power, time for stabilization of a value of an electric current supplied to the coil, or such transitional responses exert on the next processing step B with respect to reproducibility and apparatus difference can be reduced. Further, matching with high frequency power for forming a bias potential is regulated such that a matching value of a matching circuit of bias power disposed on a power supply path between a high frequency power source for forming a bias potential and an electrode in a specimen base preliminarily agrees with a matching value of the next processing step B during a state where the high frequency power is stopped (OFF).

Hereinafter, an embodiment of the present invention is described with reference to drawings.

First Embodiment

Hereinafter, the embodiment of the present invention is described with reference to FIG. 1 to FIG. 8.

FIG. 1 is a view schematically showing the configuration of a plasma processing apparatus according to the embodiment of the present invention. Particularly, the plasma processing apparatus according to this embodiment is a plasma etching processing apparatus for etching a film structure including a film layer which is an object to be processed. That is, a processing-use gas supplied into a processing chamber is subjected to electron cyclotron resonance (ECR) generated by an interaction between an electric field of a microwave which is introduced into the processing chamber by allowing the microwave to pass through a window made of dielectric and a magnetic field which is generated by an electromagnet such as a solenoid coil disposed outside the processing chamber so as to surround an upper side and a peripheral side of the processing chamber and is supplied into the processing chamber. Plasma is generated by exciting and dissociating atoms or molecules in a processing-use gas introduced into the processing chamber by such ECR. Using such plasma, the film structure including the film layer which is an object to be processed is etched. Here, the film structure is preliminarily formed on an upper surface of a substrate-like specimen such as a semiconductor wafer and includes a mask layer.

FIG. 1 is a longitudinal cross-sectional view schematically showing the configuration of the plasma processing apparatus according to the embodiment of the present invention. In FIG. 1, the plasma processing apparatus includes: a vacuum vessel 1 which has a circular cylindrical shape or a shape similar to the circular cylindrical shape to a level that the shape is regarded as a circular cylindrical shape and has an upper portion of a side wall of the circular cylindrical shape opened; an exhaust device which includes a turbo molecular pump 20 and a variable conductance valve 18 disposed below the vacuum vessel 1 and connected to a bottom surface of the vacuum vessel 1; and a plasma generating part which is disposed above and on a side of the vacuum vessel 1 and generates an electric field and a magnetic field supplied into the processing chamber 4 in the vacuum vessel 1 for generating plasma in the processing chamber 4.

The vacuum vessel 1 includes the circular-plate-like dielectric window 3 which is made of dielectric (for example, quartz) and forms a portion of the vacuum vessel 1. The dielectric window 3 is placed on an upper end portion of a circular cylindrical side wall of an upper portion of the vacuum vessel 1 from above. A back surface of an outer peripheral portion of the dielectric window 3 opposedly faces the upper surface of the upper end portion of the side wall with a sealing member such as an O ring sandwiched therebetween, and the dielectric window 3 is disposed on the sealing member. By pressing the sealing member from above and below, a gastight sealing is provided between the pressure-reduced processing chamber 4 disposed in the vacuum vessel 1 and an atmosphere exposed to an atmospheric pressure disposed outside the sealing member.

The processing chamber 4 is formed inside the vacuum vessel 1 and is disposed inside the circular cylindrical side wall. The processing chamber 4 is a space which is communicated with the exhaust device and is pressure-reduced by an operation of the exhaust device. The processing chamber 4 is also a space into which plasma generated using a processing-use gas is filled. Below the dielectric window 3, a shower plate 2 made of dielectric such as quartz and having a circular plate shape is disposed. The shower plate 2 forms a ceiling surface of the processing chamber 4. A plurality of through holes for introducing a processing-use gas into the processing chamber 4 are disposed at a center portion of the shower plate 2.

Between the shower plate 2 and the dielectric window 3, a space sandwiched between the shower plate 2 and the dielectric window 3 from below and above is disposed. A gas supply unit 16 for supplying gas to the processing chamber 4 is disposed outside the vacuum vessel 1. The gas supply unit 16 is communicated with the inside of the space through a gas introducing line 24 including a pipe, and is connected to the vacuum vessel 1. A gas to be supplied whose flow rate and flow speed are regulated by the gas supply unit 16 flows into the space through the gas introducing line 24, is dispersed in the space and, thereafter, is introduced into the processing chamber 4 through the through holes formed in the shower plate 2.

The plasma generating part for generating plasma in the processing chamber 4 is disposed above and on sides of the vacuum vessel 1. The plasma generating part includes: an electric field forming part for forming an electric field; and a magnetic field forming part for forming a magnetic field. The electric field forming part includes: a waveguide 6 which is disposed above the dielectric window 3 and through which an electric field of a microwave propagates; and a circular cylindrical cavity resonance part which is disposed below a lower end portion of the waveguide 6 and above the dielectric window 3 using an upper surface of the dielectric window 3 as a bottom surface of the cavity resonance part and into which an electric field from the waveguide 6 is introduced.

The waveguide 6 includes: a circular cylindrical waveguide portion which forms a lower portion and has an axis extending in the vertical direction; and a square-shaped waveguide portion having a rectangular cross section where one end side portion of the square-shaped waveguide portion is connected to an upper end portion of the circular waveguide portion and an axis of the square-shaped waveguide portion extends in a horizontal direction. A microwave generating power source 8 which generates an electric field of a microwave transmitted to the inside of the waveguide 6 by oscillation is disposed on the other end portion of the square-shaped waveguide portion.

In this embodiment, although a microwave having a frequency of 2.45 GHz as a frequency of an electric field which propagates through the waveguide 6 is used, the frequency of the electric field is not particularly limited. An electric field of a microwave is formed by oscillation at the other end portion of the square-shaped waveguide portion. Such an electric field propagates through the square-shaped waveguide portion in the horizontal direction, changes its direction downwardly at one end portion of the square-shaped waveguide portion and, further, propagates downwardly through the circular waveguide portion, and is introduced into the cavity resonance section 7. Then, the electric field is dispersed in the cavity resonance section 7, and the electric field in a particular mode is excited and the excited electric field of the microwave is introduced into the processing chamber 4 from above through the dielectric window 3 and the shower plate 2.

Solenoid coils 9 are disposed on an outer peripheral portion of the processing chamber 4 above the dielectric window 3 and on an outer peripheral side of the side wall of the circular cylindrical portion of the vacuum vessel 1. The solenoid coils 9 form a magnetic field forming part and a direct current is supplied to the solenoid coil 9. An electric field which is introduced into the processing chamber 4 and a magnetic field which is formed by the solenoid coil 9 to which a direct current is supplied and is introduced into the processing chamber 4 generate ECR due to an interaction between them in the processing chamber 4. As a result, atoms and molecules of a gas introduced into the processing chamber 4 are excited or dissociated so that plasma is generated in a space in the processing chamber 4 below the shower plate 2.

A specimen base 10 is disposed in a lower portion of the processing chamber 4. The specimen base 10 is disposed below a lower surface of the shower plate 2 in a state where an upper surface of the specimen base 10 oppositely faces the lower surface of the shower plate 2. The specimen base 10 has an approximately circular cylindrical shape. A dielectric-made film (not shown in the drawing) which is formed by a thermal spraying method is formed on an upper surface of the specimen base 10 on which a wafer 11 which is an object to be processed is placed. A direct current power source 15 is connected to at least one film-shaped electrode arranged inside the dielectric-made film via a high frequency filter 14 so that direct current (DC) power is supplied to the electrode. A circular plate-like or circular cylindrical conductive substrate is disposed inside the specimen base 10, and the substrate is connected to a high frequency power source 13 via a matching circuit 12 thus enabling the supply of high frequency power to the substrate.

The vacuum discharge device is disposed below the vacuum vessel 1. The vacuum discharge device is formed of a variable conductance valve 18 and a turbo molecular pump 20. A dry pump 19 is communicably connected to an outlet of the turbo molecular pump 20 via an exhaust pipe. A vacuum exhaust port 5 is formed in a bottom surface of the processing chamber 4 in the vacuum vessel 1 below the specimen base 10. The vacuum exhaust port 5 has a circular shape and is disposed at a position where the center of the vacuum exhaust port 5 agrees with an axis of the specimen base 10 disposed above the vacuum exhaust port 5 or at a position close to the abovementioned position where the center of the vacuum exhaust port 5 is considered to agree with the axis of the specimen base 10. The vacuum exhaust port 5 and the variable conductance valve 18 are connected with each other via an exhaust pipe. Flow rates of a gas and particles of a reaction product in the processing chamber 4 which flow into the turbo molecular pump 20 are regulated corresponding to increase or the decrease of a degree of opening of the variable conductance valve 18.

In this embodiment, an etching gas line (first gas supply line) 22 is disposed between the gas supply unit 16 and the gas introducing line 24 which is connected to the vacuum vessel 1. The etching gas line 22 is communicably connected with the gas supply unit 16 and the gas introducing line 24. A processing-use gas supplied from the gas supply unit 16 to the gas introducing line 24 flows through the etching gas line 22. As described later, the gas introducing line 24 is communicably connected to a transition step gas supply unit 105 via a transition step gas line 110. The transition step gas line 110 is disposed such that a transition step gas supplied from a transition step gas source 117 to the gas introducing line 24 flows through the transition step gas line 110.

The plasma processing device further includes an exhaust line 21 and a waste gas line 23. The exhaust line 21 connects the turbo molecular pump 20 of the vacuum discharge device with the dry pump 19 for coarse suction to each other and makes an outlet of the turbo molecular pump 20 and an inlet of the dry pump 19 communicate with each other. The waste gas line 23 communicably connects the etching gas line 22 and the transition step gas line 110 to the exhaust line 21 so as to introduce a gas from the etching gas line 22 and a gas from the transition step gas line 110 to the exhaust line 21 respectively. A gas switching unit 100 is disposed on the etching gas line 22, the transition step gas line 110 and the gas line which communicably connects the etching gas line 22 and the transition step gas line 110 to the waste gas line 23.

The plasma processing apparatus having the abovementioned configuration further includes a vacuum conveyance vessel not shown in the drawing which is connected to the side wall of the vacuum vessel 1 and has a pressure-reduced conveyance chamber, and a conveyance device such as a robot arm is disposed inside the conveyance chamber. A wafer 11 placed on a distal end portion of an arm of the conveyance device is conveyed from the conveyance chamber and is carried in the processing chamber 4. When the wafer 11 is transferred to the specimen base 10 and is placed on an upper surface of the specimen base 10, the wafer 11 is held in a state where the wafer 11 is attracted to the specimen base 10 by an electrostatic force of a direct current (DC) voltage applied from the direct current power source 15.

In such a state, in the processing chamber 4, due to an operation of the turbo molecular pump 20, particles in the processing chamber 4 are discharged from the vacuum exhaust port 5, and a predetermined processing-use gas, an etching gas in this embodiment, is supplied from the gas supply unit 16 into the processing chamber 4. With respect to a pressure in the processing chamber 4, a control part not shown in the drawing detects the pressure by receiving an output from a pressure gauge 17 which detects the pressure in the processing chamber 4, and transmits command signals to the mass flow controller disposed in the gas supply unit 16 and the variable conductance valve 18 in response to a detection result and regulates the pressure such that the pressure takes a value which falls within a range suitable for processing by taking a balance between these operations.

Thereafter, an electric field and a magnetic field are applied to the inside of the processing chamber 4 so that plasma is generated using an etching gas in the space formed between the specimen base 10 and the shower plate 2 in the processing chamber 4. In a state where the plasma is generated, high frequency power is applied from the high frequency power source 13 to the electrode disposed inside the specimen base 10 so that a bias potential is formed above the wafer 11 and charged particles such as ions in the plasma are attracted to the surface of the wafer 11 whereby etching processing of a film which is an object to be processed and is disposed on the surface of the wafer 11 progresses. In this embodiment, the etching processing is performed using an etching gas where plural kinds of gases are mixed with each other. In this case, a plurality of steps which differ from each other with respect to plural kinds of mixed gases in flow rate and mixing ratio (including 0%), that is, with respect to plural kinds of mixed gases which differ each other in so-called composition are performed discontinuously and repeatedly. Further, the etching processing of this embodiment includes transition steps each of which connects two consecutive steps, that is, the preceding step and the succeeding step out of the plurality of steps.

When the end of the etching processing is detected by the control part not shown in the drawing, the supply of high frequency power for forming a bias from the high frequency power source is stopped in response to a command signal from the control part and, at the same time, the plasma is extinguished. Then, an electrostatic force which attracts the wafer 11 to the dielectric-made film of the specimen base 10 is removed. The wafer 11 is transmitted to the conveyance device such as a robot arm which enters the inside of the processing chamber 4 and is conveyed to the conveyance chamber outside the processing chamber 4 due to retraction of the conveyance device. When another wafer 11 is prepared, another wafer 11 is carried in the processing chamber 4, and another wafer 11 is processed in the same manner as described above. When the control part determines that there is no wafer 11 to be processed, the processing chamber 4 and the conveyance chamber are terminated or closed from each other. Accordingly, an operation of the plasma processing apparatus in a processing mode where the wafer 11 is processed by a vacuum processing unit including the processing chamber 4 is stopped, and the plasma processing apparatus is operated in a maintenance mode for maintenance and inspection when necessary.

Next, the gas switching unit 100 having a high-speed gas switching mechanism is described.

The gas switching unit 100 includes: a first valve 101 which is disposed on the etching gas line 22; a first bypass line 103 which is disposed between a portion of the etching gas line 22 between the gas supply unit 16 and the first valve 101 and the waste gas line 23 so as to make the portion of the etching gas line 22 and the waste gas line 23 communicably connect with each other; and a second valve 102 which is disposed on the first bypass line 103. In the abovementioned configuration, the first bypass line 103 is provided for allowing a processing-use gas supplied from the gas supply unit 16 to flow and to be discharged toward the dry pump 19 through the waste gas line 23.

The gas switching unit 100 further includes: a third valve 111 which is disposed on the transition step gas line 110 for introducing a noble gas such as argon or an inert gas into the processing chamber 4 during a transition step performed between two consecutive steps, that is, the preceding step and the succeeding step at the time of processing the wafer 11; a second bypass line 113 which is disposed between a portion of the transition step gas line 110 between the transition step gas supply unit 105 and the third valve and the waste gas line 23 so as to make the portion of the transition step gas line 110 and the waste gas line 23 communicate with each other; and a fourth valve 112 which is disposed on the second bypass line 113. In the abovementioned configuration, the second bypass line 113 is provided for allowing a transition step gas from the transition step gas supply unit 105 to flow and to be discharged toward the dry pump 19 through the waste gas line 23. The transition step gas supply unit 105 of this embodiment includes: the transition step gas source 117 which is communicably connected to the transition step gas line 110; and the transition step gas mass flow controller 114 which is disposed on the transition step gas line 110. The transition step gas supply unit 105 regulates a flow rate or a flow speed of a transition step gas which flows through the inside of the mass flow controller 114.

A pressure gauge 104 is disposed on the gas introducing line 24, and a pressure gauge 131 is disposed on the waste gas line 23 between a connecting portion of the waste gas line 23 with the exhaust line 21 and a connecting portion between the first bypass line 103 and the second bypass line 113. In this embodiment, with respect to a gas line ranging from the connecting portion of the first bypass line 103 disposed on the etching gas line 22 to the pressure gauge 104 on the gas introducing line 24 through the etching gas line 22 and a gas line ranging from such a connecting portion to the pressure gauge 131 on the waste gas line through the first bypass line 103, these gas lines are respectively formed such that lengths of pipes which form the gas lines and shapes of the pipes, that is, when these gas lines are respectively formed of a pipe having a circular cross section, a change (profile) in size in a perpendicular axial direction which passes the center of a diameter or a radius of the circular shape becomes equal. Hereinafter, the connecting portion is referred to as an etching gas line switching portion 25.

Further, a variable conductance valve 132 is disposed on the waste gas line 23. The variable conductance valve 132 is configured such that a degree of opening of the variable conductance valve 132 is increased or decreased in response to a command signal from the control part so that a value of the pressure gauge 131 and a value of the pressure gauge 104 become equal. That is, the variable conductance valve 132 is regulated such that a pressure in the gas introducing line 24 and a pressure in the waste gas line 23 become equal.

Next, the matching circuit 12 according to this embodiment is described with reference to FIG. 2. FIG. 2 is a circuit block diagram schematically showing the configuration of the matching circuit 12 of the plasma processing apparatus according to the embodiment shown in FIG. 1.

The matching circuit 12 of this embodiment is disposed on a power supply path between the high frequency power source 13 which supplies high frequency power of a predetermined frequency, in this embodiment, 400 kHz or 800 kHz and the electrode disposed inside the specimen base 10. The matching circuit 12 is formed of the impedance controller 26, a first matching variable element 27 and a second matching variable element 28 which are arranged in series in order from the side closer to the high frequency power source 13. An impedance external indicator 29 is electrically connected to the first matching variable element 27 and the second matching variable element 28 respectively via switches.

In the matching circuit 12 of this embodiment, a command source of a signal which regulates an operation of the first matching variable element 27 and an operation of the second matching variable element 28 can be switched between the impedance controller 26 and the impedance external indicator 29 by opening or closing the switches. When the first matching variable element 27 and the second matching variable element 28 are connected to the impedance controller 26, the impedance controller 26 controls the first matching variable element 27 and the second matching variable element 28 such that matching is established while monitoring a deviation of impedance. On the other hand, when the first matching variable element 27 and the second matching variable element 28 connected to the impedance external indicator 29, the impedance external indicator 29 controls the first matching variable element 27 and the second matching variable element 28 such that the first matching variable element 27 and the second matching variable element 28 take arbitrary values. This switching using the switches is performed in response to a command from the control part coupled with stoppage (OFF) of high frequency power from the high frequency power source 13.

Next, processing of the wafer 11 which the plasma processing apparatus according to this embodiment performs is described in detail with reference to FIG. 3. FIG. 3 is a table showing the flow of a plurality of steps which form processing of a wafer which the plasma processing apparatus according to the embodiment shown in FIG. 1 performs.

In this embodiment, the processing of the wafer 11 is formed of a plurality of steps. In the processing of the wafer 11, the respective processing steps consists of: a processing step A and a processing step B where the processing is performed under different conditions; and a transition step disposed between the respective processing steps. Further, these processing steps A, B are performed plural times or in a repeated manner with the transition step sandwiched between the processing steps A, B until it is determined that the processing steps A, B are performed predetermined number of times or a target is acquired.

During the period of the transition step, the supply of high frequency power for forming a bias potential above an upper surface of the wafer 11 is stopped (turned off) and such a state is maintained. Then, values of parameters indicating conditions of processing including power of a microwave which the microwave generating power source generates, a current supplied to the solenoid coils 9, and a pressure in the processing chamber 4 are changed from values for the processing step A to values for the processing step B and, at the same time, a gas supplied to the gas introducing line 24 is switched to a noble gas such as an argon gas or an inert gas from the transition step gas supply unit 105, and a transition step gas is introduced into the processing chamber 4. In such an operation, the transition step gas is supplied to the gas introducing line 24 with a flow rate corrected by taking into account viscosity such that a flow rate of the transition step gas is regarded equal to a flow rate of a processing-use gas used in the processing step B.

In this embodiment, power of an electric field which the microwave generating power source 8 generates, an electric current supplied to the solenoid coils 9, a pressure in the processing chamber 4, and a flow rate of a gas supplied into the gas introducing line 24 or the processing chamber 4 are changed during the transition step in conformity with the succeeding processing step. Further, matching with bias generating high frequency power is performed such that, during the transition step where bias generating high frequency power is maintained in an OFF state, the first matching variable element 27 and the second matching variable element 28 are preliminarily set to proper matching values under a processing condition of the succeeding processing step. With such an operation, it is possible to suppress adverse effects which a transient response time from a point of time that a change of the abovementioned values of parameters is instructed such as a time necessary for matching of microwave power, a time for stabilizing an electric current for the solenoid coil 9 and a pressure in the processing chamber 4 causes. Such adverse effects may be lowering of reproducibility of processing or the increase of difference between apparatuses.

Figure 4:
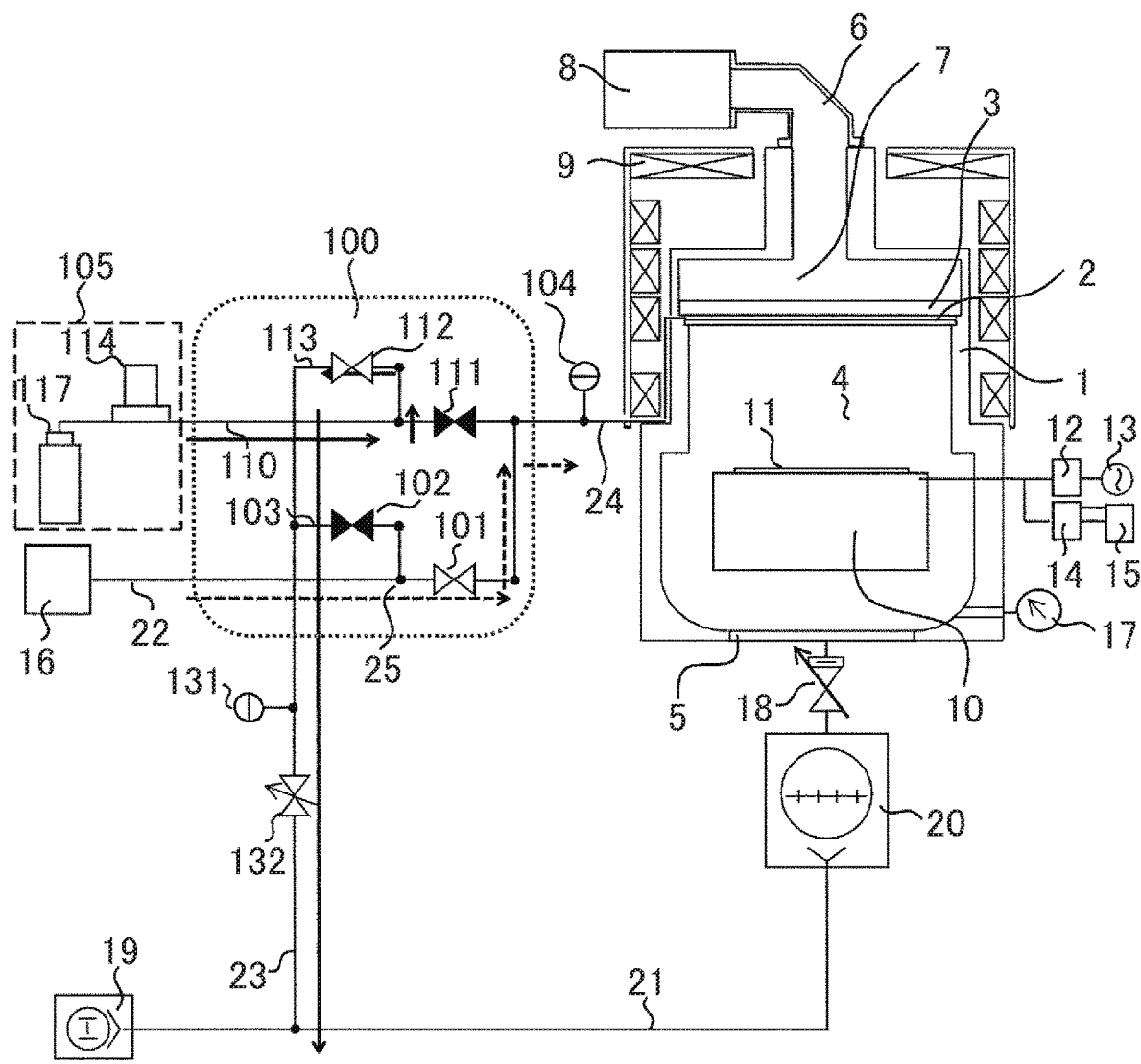
FIG. 4 is a view schematically showing the flow of a gas in a gas switching unit in a processing step A which the plasma processing apparatus according to the embodiment shown in FIG. 1 performs.
Figure 5:
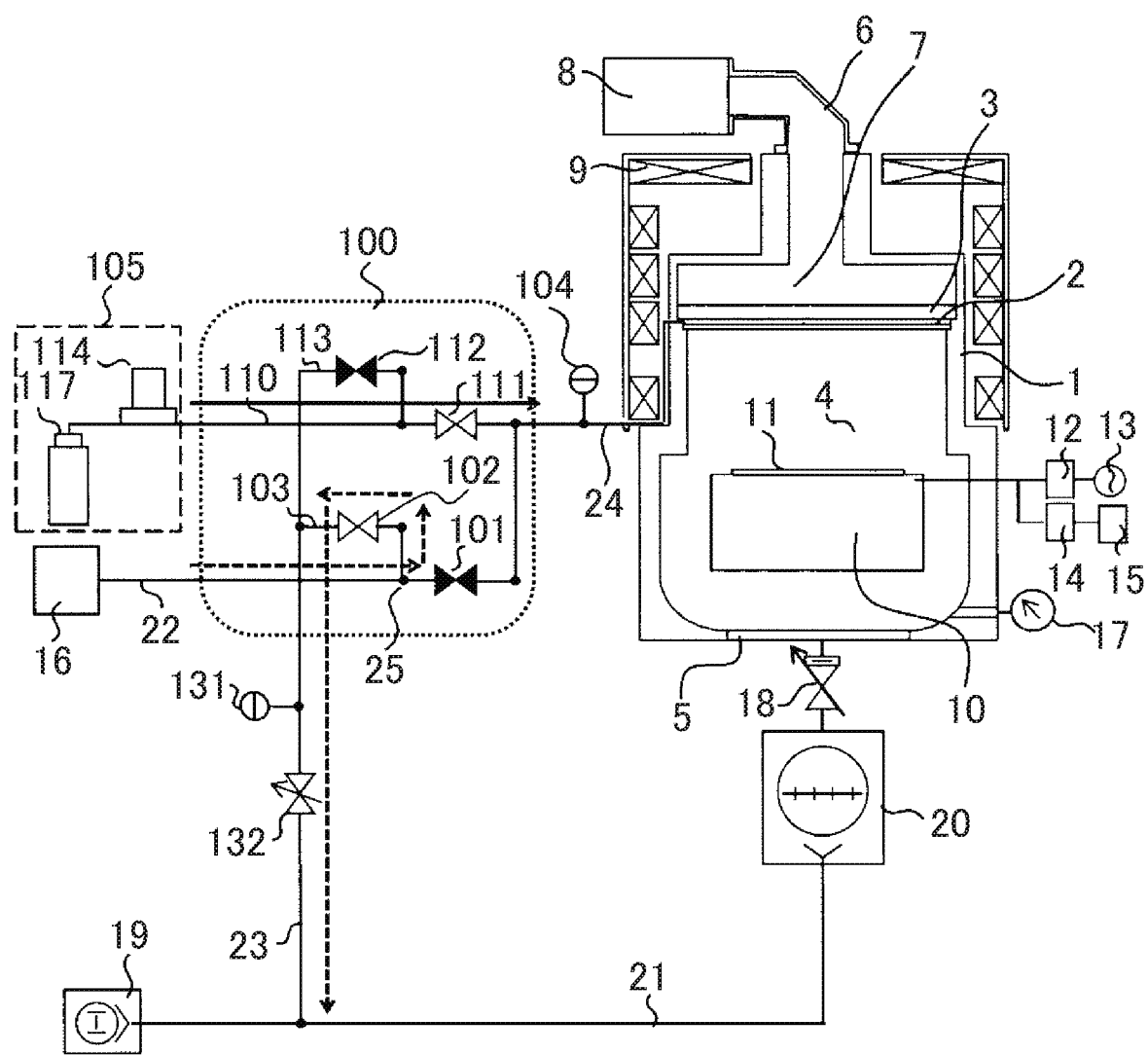
FIG. 5 is a view schematically showing the flow of a gas in the gas switching unit in a transition step which the plasma processing apparatus according to the embodiment shown in FIG. 1 performs.
Figure 6:
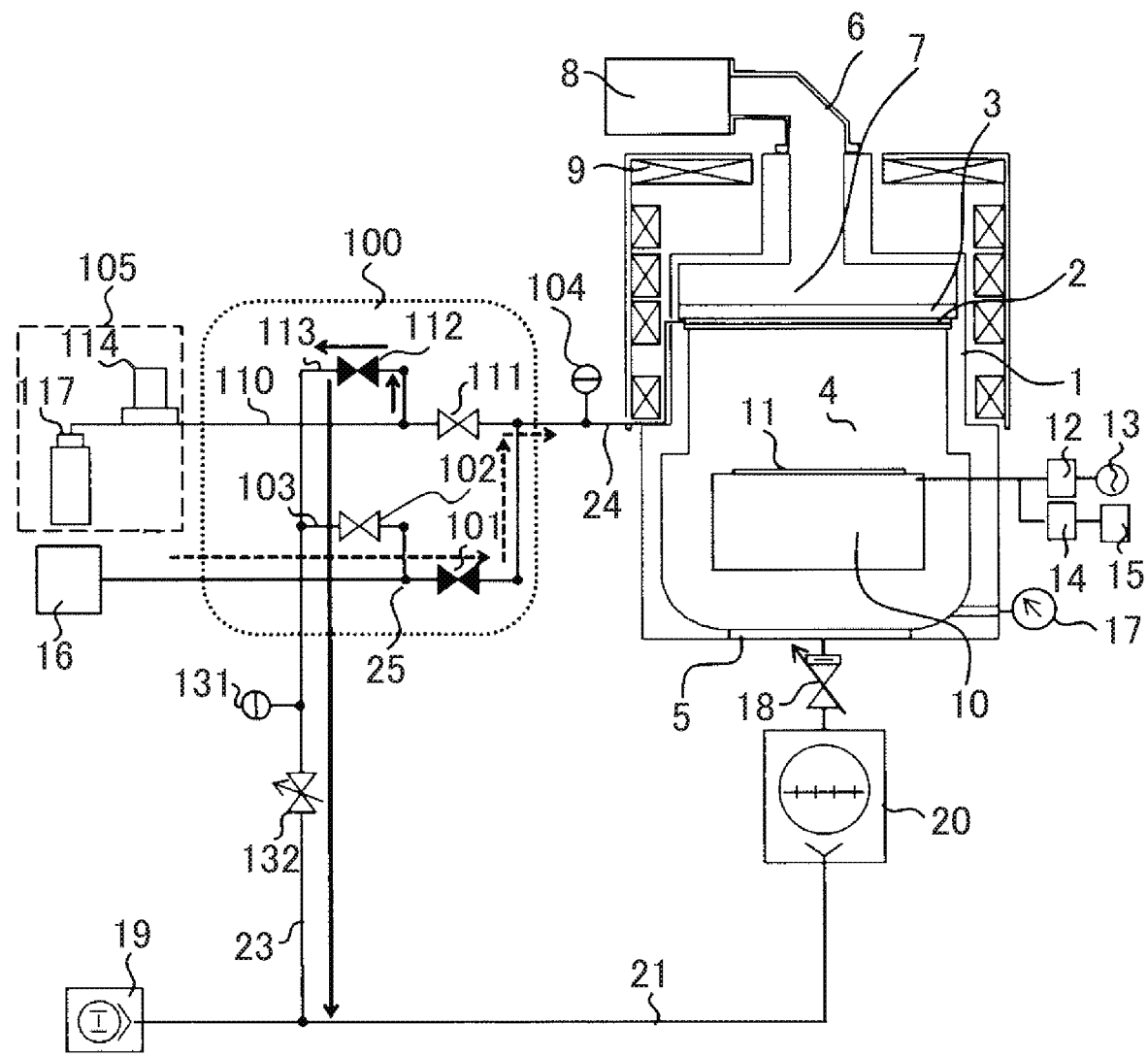
FIG. 6 is a view schematically showing the flow of a gas in the gas switching unit in a processing step B which the plasma processing apparatus according to the embodiment shown in FIG. 1 performs.

The flow of a gas supplied to the processing chamber 4 of the plasma processing apparatus according to this embodiment is described with reference to FIG. 4 to FIG. 6. FIG. 4 is a view schematically showing the flow of a gas in the gas switching unit 100 in the processing step A which the plasma processing apparatus according to the embodiment shown in FIG. 1 performs. Operations of the plurality of valves of the gas switching unit 100 and the variable conductance valve 132 of this embodiment are regulated in response to command signals from the control part not shown in the drawing in the same manner as operations of the mass flow controller for a processing-use gas included in the gas supply unit 16 and the transition step gas mass flow controller 114, the microwave generating power source 8, the solenoid coil 9, the vacuum discharge device including the variable conductance valve 18, and the valve not shown in the drawing for opening and closing the communication path between the vacuum vessel 1 and the conveyance chamber, and the conveyance device for a wafer 11 inside the conveyance chamber.

In the processing step A, in response to a command signal from the control part at the time of starting the processing step A, the first valve 101 on the etching gas line 22 is opened and, at the same time, the second valve 102 is closed. Accordingly, an etching gas according to a condition A which is a processing condition of the processing step A is supplied from the gas supply unit 16 to the gas introducing line 24 through the etching gas line 22 (in the drawing, indicated by a dashed arrow) and, thereafter, is supplied to the processing chamber 4, and such a state is maintained. Further, during the processing step A, the third valve 111 is closed and, at the same time, the fourth valve 112 is opened. Accordingly, an argon gas from the transition step gas source 117 disposed inside the transition step gas supply unit 105 is supplied to the waste gas line 23 through the transition step gas supply line 110 and the second bypass line 113 in a state where a flow rate of the argon gas is regulated to a flow rate corrected by taking into account viscosity such that the flow rate of the argon gas is regarded equal to a flow rate of an etching gas under a condition B which is a processing condition of the processing step B in the transition step gas mass flow controller 114 (in the drawing, indicated by a solid arrow), and the argon gas is discharged to the outside of the plasma processing apparatus from the dry pump 19. Further, in the processing step A, a degree of opening of the variable conductance valve 132 is regulated in response to a command signal from the control part such that a value of the pressure gauge 131 on the waste gas line 23 and a value of the pressure gauge 104 on the gas introducing line 24 become equal and hence, a pressure in the waste gas line 23 is regulated and is maintained.

The flow of a gas supplied to the processing chamber 4 of the plasma processing apparatus during the transition step is described with reference to FIG. 5. FIG. 5 is a view schematically showing the flow of a gas in the gas switching unit 100 in the transition step which the plasma processing apparatus according to the embodiment shown in FIG. 1 performs.

In the transition step, in starting the transition step, the forth valve 112 is closed and the third valve 111 is opened in response to a command signal from the control part so that an argon gas whose flow rate is corrected by taking into account viscosity such that the flow rate of the argon gas becomes substantially equal to a flow rate of an etching gas under the condition B is supplied to the gas introducing line 24 from the transition step gas mass flow controller 114 through the transition step gas line 110 (in the drawing, indicated by a solid arrow) and, thereafter, is supplied to the processing chamber 4, and such a state is maintained. In parallel to such an operation, the first valve 101 on the etching gas line 22 is closed and the second valve 102 is opened so that an etching gas under the condition A is supplied from the gas supply unit 16 to the waste gas line 23 through the first bypass line 103 (in the drawing, indicated by a dashed arrow), and the etching gas is discharged to the outside by the dry pump 19.

Then, the supply of an etching gas from the gas supply unit 16 is changed by switching from the supply under the condition A to the supply under the condition B. During the transition step, a degree of opening of the variable conductance valve 132 is regulated in response to a command signal from the control part such that a value of the pressure gauge 131 of the waste gas line and a value of the pressure gauge 104 of the gas introducing line 24 become equal, and such a state is maintained.

The flow of a gas supplied to the processing chamber 4 of the plasma processing apparatus in the processing step B is described with reference to FIG. 6. FIG. 6 is a view schematically showing the flow of a gas in the gas switching unit 100 in the processing step B which the plasma processing apparatus according to the embodiment shown in FIG. 1 performs.

In the processing step B, at the time of starting the processing B, the second valve 102 disposed on the first bypass line 103 is closed and the first valve 101 is opened in response to a command signal from the control part so that an etching gas under the condition B is supplied from the gas supply line 16 to the gas introducing line 24 (in the drawing, indicated by a dashed arrow) and, thereafter, is supplied to the processing chamber 4, and such a state is maintained. In parallel to such an operation, the third valve 111 is closed and the fourth valve 112 is opened so that a transition step gas is supplied to the waste gas line 23 through the transition step gas line 110 and the second bypass line 113 after the flow rate of the transition step gas is regulated to a flow rate corrected by taking into account viscosity such that a flow rate of the transition step gas is regarded as equal to a flow rate of an etching gas of a condition C which is a processing condition of the processing step C succeeding to the processing step B (becoming the condition A again when the condition of the succeeding step is the condition A) in the transition step mass flow controller 114 (in the drawing, indicated by a solid arrow), and the transition step gas is discharged to the dry pump 19. Further, a degree of opening of the variable conductance valve 132 is regulated such that a value of the pressure gauge 131 and a value of the pressure gauge 104 become equal to each other.

In the processing of the wafer 11 of this embodiment, the respective steps and the transition step between the respective steps are repeatedly performed in a switching manner until the control part determines that the end of the processing has arrived or the abovementioned steps are performed predetermined times. Further, during the periods of the respective steps of the processing of this embodiment, an argon gas which is a transition step gas is supplied to the gas introducing line 24 with a flow rate which is corrected by taking into account viscosity thereof such that a flow rate of the argon gas can be regarded as substantially a flow rate simulating the supply of a processing-use gas to be used in the succeeding processing step (an etching gas in this embodiment).

Figure 7A:
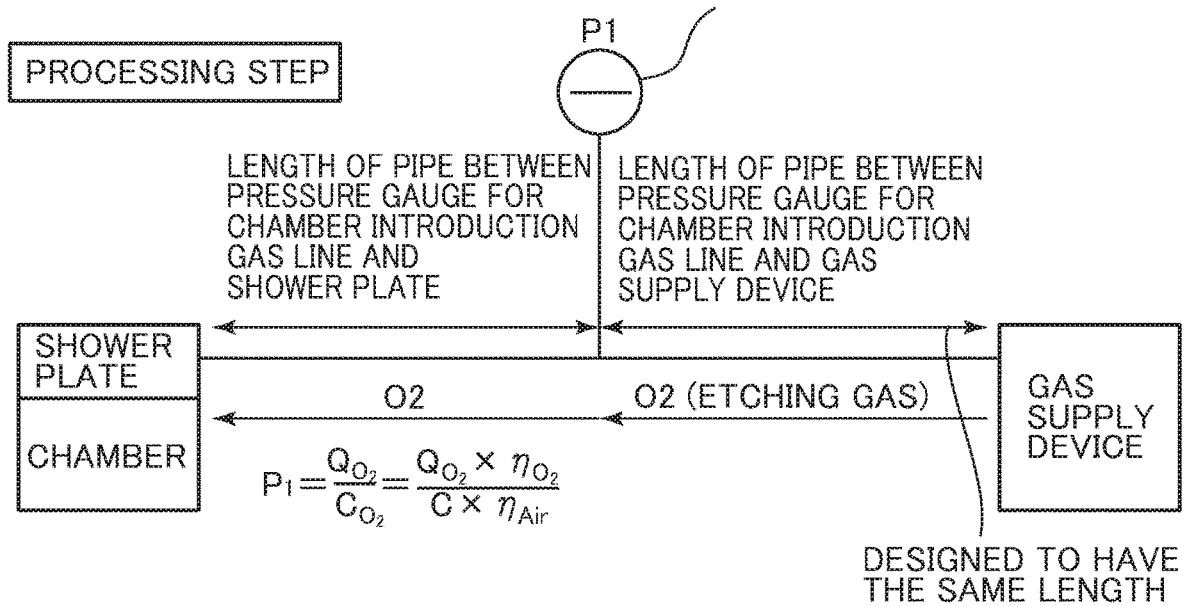
FIGS. 7A and 7B are views schematically showing a method of correcting a flow rate of a transition step gas in respective steps of the processing which the plasma processing apparatus according to the embodiment shown in FIG. 1 performs.
Figure 7B:
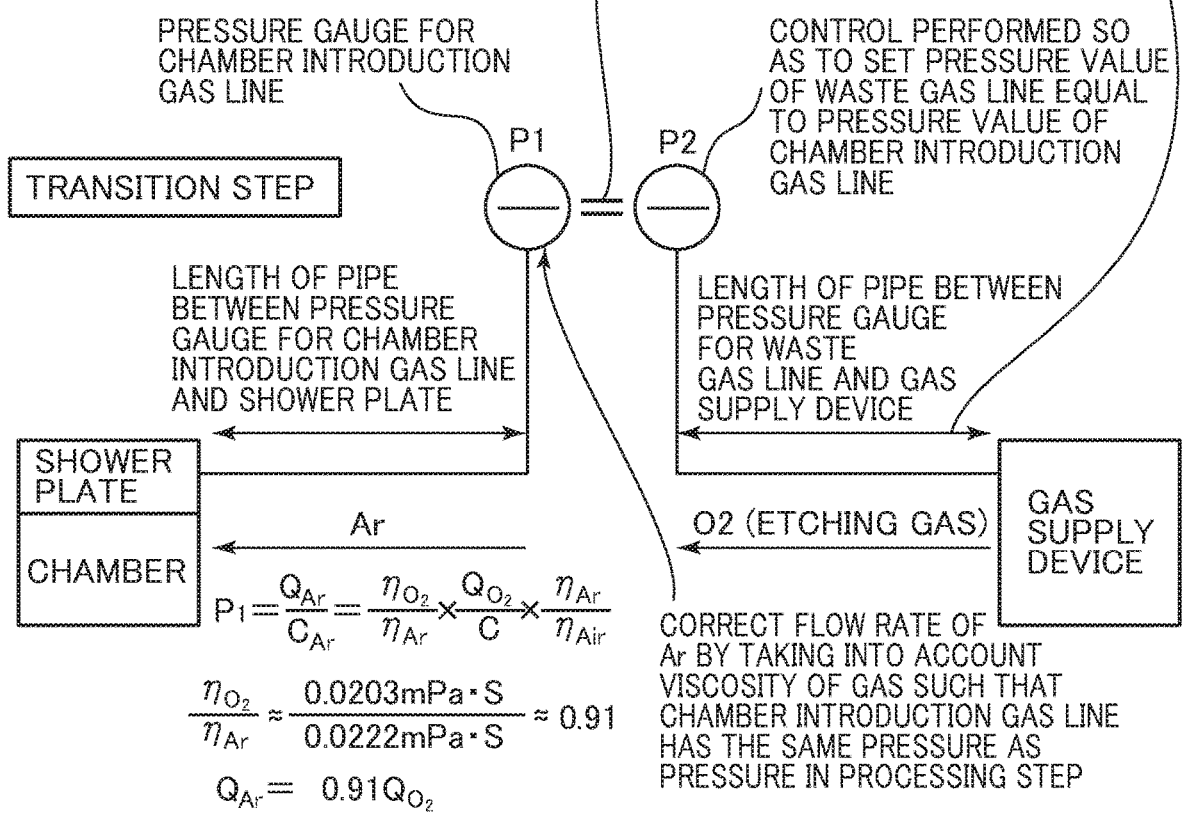

A method of correcting a flow rate of an argon gas supplied during the respective steps is described with reference to FIGS. 7A and 7B. FIGS. 7A and 7B are views schematically showing the method of correcting a flow rate of a transition step gas in the respective steps of the processing which the plasma processing apparats according to the embodiment shown in FIG. 1 performs. FIGS. 7A and 7B show two steps, that is, a processing step and a transition step in one etching, and $O_2$ is used as an example of an etching gas.

In the processing step shown in FIG. 7A, the flow of a gas in the gas introducing line 24 from the pressure gauge 104 to the shower plate 2 is expressed as follows in case of a viscous flow region.

[Formula 1]

$$Q_{O_2} = C_{O_2}(P_1 - P_0) \dot{X} \cdot P_0 \cong 0 \tag{1}$$

In this formula 1, $QO_2$ is a flow rate of an $O_2$ gas (Pa·m3), P1 is a pressure value (Pa) of the pressure gauge 104 for a chamber introducing gas line, $CO_2$ is a conductance from the pressure gauge 104 for the chamber introducing gas line to the shower plate 2 when an oxygen gas is used, and P0 is a chamber pressure. In this embodiment, a chamber pressure is sufficiently small compared to a gas line pressure and hence, the relationship of P0≈0 is established.

A pressure P1 in the processing step can be expressed by the following formula.

[Formula 2]  (2)

$$P_1 = \frac{Q_{O_2}}{C_{O_2}} = \frac{Q_{O_2} \times \eta_{O_2}}{C \times \eta_{Air}}$$

In the formula 2, C is a conductance of a pipe from the pressure gauge 104 for the chamber introducing gas line to the shower plate 2, $\eta O_2$ is a viscosity coefficient of an $O_2$ gas, and $\eta Air$ is a viscosity coefficient of air.

A pressure value P1 of the pressure gauge 104 for the chamber introducing gas line in the transition step can be expressed as follows. Since gases flow through the same path in both the transition step and the processing step and hence, a conductance C takes the same value in both the transition step and the processing step. Accordingly, by correcting a flow rate at a ratio between viscosity coefficients of gases, a value P1 in the transition step can be set equal to a value P1 in the processing step.

[Formula 3]  (3)

$$P_1 = \frac{Q_{Ar}}{C_{Ar}} = \frac{\eta_{O_2}}{\eta_{Ar}} \times \frac{Q_{O_2}}{C} \times \frac{\eta_{Ar}}{\eta_{Air}}$$

[Formula 4]  (4)

$$\frac{\eta_{O_2}}{\eta_{Ar}} \approx \frac{0.0203 \text{ mPa·S}}{0.0222 \text{ mPa·S}} \approx 0.91$$

[Formula 5]  (5)

$$Q_{Ar} = 0.91 Q_{O_2}$$

In the formulae 3 to 5, CAr is a conductance from the pressure gauge 104 for the chamber introducing gas line to the shower plate 2 when an argon gas is used, and $\eta Ar$ is a viscosity coefficient of an argon gas.

As described above, a flow rate of an argon gas is corrected with a viscosity coefficient such that a pressure value of the pressure gauge 104 on the gas introducing line 24 when an argon gas is made to flow in the transition step becomes equal to a pressure value of the pressure gauge 104 in the processing step. Further, an operation of the variable conductance valve 132 is regulated such that a value of the pressure gauge 131 on the waste gas line 23 and a value of the pressure gauge 104 become equal. In this embodiment, at least a gas line formed of a portion of the etching gas line 22 from the etching gas line switching portion 25 on the etching gas line 22 and a portion of the gas introducing line 24 to the pressure gauge 104, and at least a gas line formed of the first bypass line 103 extending from the etching gas line switching portion 25 and a portion of the waste gas line 23 to the pressure gauge 131 are set such that pipes which form the respective gas lines have the same length and the same profile in size in the axial direction of the pipe passage. With such a configuration, the length and the profile of the gas line between the pressure gauge 104 and the gas supply unit 16 in the processing step and the length and the profile of the gas line between the pressure gauge 131 and the transition step gas supply unit 105 in the transition step can be set equal. Accordingly, it is possible to switch the step from the transition step to the next processing step in a state where the flow and a pressure of the gas is stabilized before the next processing step is started by simulating the flow of the processing-use gas in the next processing step supplied to the waste gas line 23 as the flow of a gas under a condition of the next processing step in the transition step and hence, a change in condition of the supply of a processing-use gas to the processing chamber 4 at the time of performing switching can be suppressed.

Figure 8A:
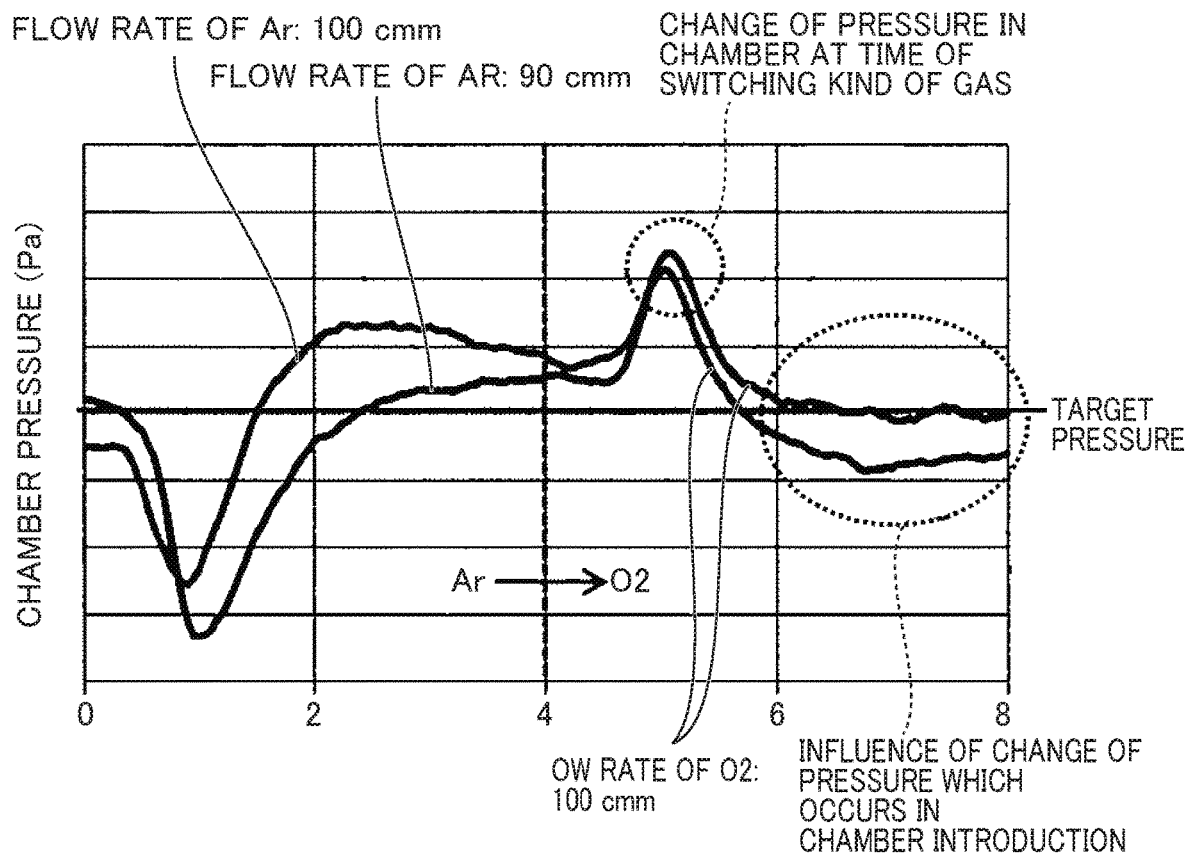
FIGS. 8A and 8B are view showing a chamber pressure according to the embodiment of the present invention.
Figure 8B:
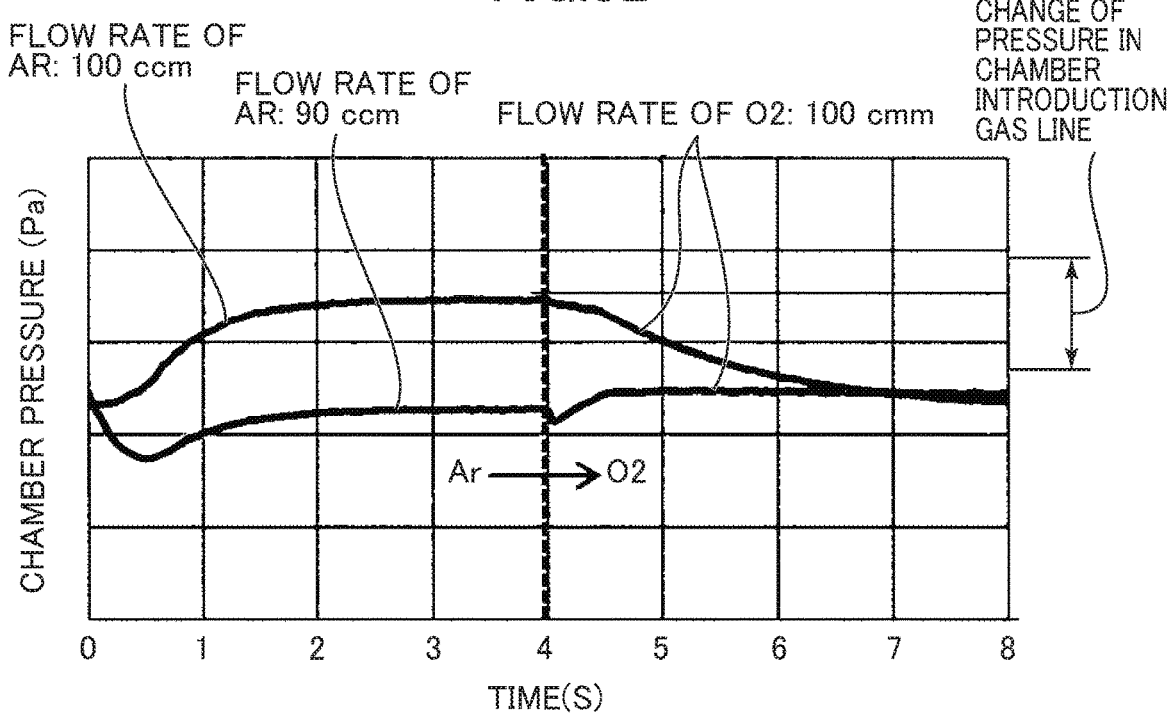

The manner of operation of this embodiment is described with reference to FIGS. 8A and 8B. FIGS. 8A and 8B are graphs showing a change in pressure in the processing chamber and a change in pressure in the gas line when an operation of the plasma processing apparatus according to the embodiment shown in FIG. 1 is switched from the transition step to the processing step. In this embodiment, as conditions, two conditions are exemplified. In one condition, a flow rate of an argon gas in the transition step is set to 100 ccm which is equal to a flow rate (100 ccm) of an $O_2$ gas which is an etching gas, and in the other condition, the flow rate of the argon gas in the transition step is set to a corrected flow rate of 90 ccm.

A gas line pressure is obtained by plotting values of the pressure gauge 104. The gas line pressure is changed when a flow rate is switched from an Ar flow rate of 100 ccm to an $O_2$ flow rate of 100 ccm. However, when Ar flow rate is switched from a corrected value of 90 ccm to the $O_2$ flow rate 100 ccm, a change in pressure is suppressed. Further, also with respect to a pressure in the processing chamber 4, such a change in pressure also occurs due to the difference in kind of a gas immediately after the switching of a gas under respective conditions. However, with respect to an influence exerted on a change in pressure which occurs in the gas introducing line 24 after the change in pressure occurs, a change in pressure can be suppressed more under a condition where Ar flow rate is corrected, and a pressure can be stabilized within 2 seconds.

As a method of correcting a flow rate of the transition step gas, a single kind of $O_2$ is used as an etching gas in the embodiment. However, when a mixture gas is used, a flow rate of the mixture gas can be corrected by obtaining a correction coefficient using a flow rate ratio and a viscosity coefficient for respective kinds of gases. In the abovementioned description, a viscous flow is used as the flow in the gas introducing line 24. However, when the flow in the gas introducing line 24 is a molecular flow, a correction amount can be obtained in the same manner as the abovementioned case using a molecular weight in place of a viscosity coefficient.

The present invention is not limited to the embodiment described above and includes various modifications. For example, the embodiment described above is an embodiment described in detail in order to facilitate the understanding of the invention and is not always intended to be limited to an embodiment which includes all constitutional elements described in the embodiment.

What is claimed is:

1. A plasma processing method where a wafer which is an object to be treated is placed and held on an upper surface of a specimen base disposed in a lower portion of a pressure reduced processing chamber disposed in a vacuum vessel, plasma is generated in the processing chamber, and the wafer is processed using the plasma, the method comprising:

first and second processing steps in each of which the wafer is processed; and a bridging step which occurs between the first and second processing steps, wherein, in a transition between the first and second processing steps and the bridging step, the method further comprises switching (1) a supply of a first processing-use gas for the first processing step and a supply of a second processing-use gas for the second processing step from a processing-use gas supply unit into a gas introducing line which is provided in communication with the processing chamber during each of two processing steps and (2) a supply of the bridging-use gas from a bridging-use gas supply unit into the gas introducing line during the bridging step, and wherein a flow rate of the bridging-use gas supplied into the gas introducing line during the bridging step is regulated such that a pressure of the bridging-use gas is equal to a pressure of the second processing-use gas to be supplied to the processing chamber via the gas introducing line during the second processing step out of the first and second processing steps at predetermined positions on the gas introducing line and an introducing port of the gas introducing line for the processing chamber.

2. The plasma processing method according to claim 1, wherein in starting the first and second processing steps and the bridging step, the combination of a communication between a waste gas line which connects the processing-use gas supply line for connecting the processing-use gas supply unit with the gas introducing line and the bridging-use gas supply line for connecting the bridging-use gas supply unit with the gas introducing line with the exhaust pump, the processing chamber, and the processing-use gas supply line and the bridging-use gas supply lines is switched.

3. The plasma processing method according to claim 1, wherein an operation of a variable valve which variably regulates an opening of an inside of the variable valve and is disposed on the waste gas line is configured to be operated such that a value detected from a first pressure gauge disposed on the gas introducing line mounted on the vacuum vessel and communicably connecting the processing chamber with the processing-use gas supply line and detects a pressure in the gas introducing line, and a value detected by a second pressure gauge disposed on the waste gas line for detecting a pressure in the waste gas line are set equal.

4. The plasma processing method according to claim 1, wherein during the bridging step, a pressure in the processing chamber into which the bridging-use gas is supplied and a predetermined value of high frequency power supplied to an electrode disposed inside the specimen base are regulated in conformity with pressure in the processing chamber of the next processing step out of the two processing steps.

* * * * *